(12) United States Patent
Garcia

(10) Patent No.: US 7,352,039 B2
(45) Date of Patent: Apr. 1, 2008

(54) METHODS AND APPARATUSES FOR MICROELECTRONIC ASSEMBLY HAVING A MATERIAL WITH A VARIABLE VISCOSITY AROUND A MEMS DEVICE

(75) Inventor: Jason A. Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 11/089,906

(22) Filed: Mar. 24, 2005

(65) Prior Publication Data

US 2006/0214246 A1    Sep. 28, 2006

(51) Int. Cl.
*H01L 23/10* (2006.01)

(52) U.S. Cl. .............................. 257/415; 257/E23.194

(58) Field of Classification Search ................. 257/619, 257/E23.119, E23.188, E23.194, E23.128
See application file for complete search history.

(56) References Cited

U.S. PATENT DOCUMENTS

| | | | |
|---|---|---|---|
| 5,130,889 A | | 7/1992 | Hamburgen et al. |
| 5,455,457 A | | 10/1995 | Kurokawa |
| 5,880,524 A | | 3/1999 | Xie |
| 5,963,788 A | * | 10/1999 | Barron et al. ................. 438/48 |
| 6,029,343 A | | 2/2000 | Wieloch |
| 6,084,297 A | | 7/2000 | Brooks et al. |
| 6,087,682 A | | 7/2000 | Ando |
| 6,146,921 A | | 11/2000 | Barrow |
| 6,163,458 A | | 12/2000 | Li |
| 2003/0148550 A1 | * | 8/2003 | Volant et al. .................. 438/52 |
| 2004/0097002 A1 | * | 5/2004 | Pogge et al. ................... 438/52 |
| 2005/0089283 A1 | * | 4/2005 | Michael et al. ................ 385/94 |
| 2005/0093397 A1 | * | 5/2005 | Yamada et al. .............. 310/320 |
| 2005/0170637 A1 | * | 8/2005 | Chou .......................... 438/626 |
| 2006/0081043 A1 | * | 4/2006 | Silverbrook et al. ........... 73/146 |

OTHER PUBLICATIONS http://www.harpellassociates.com/a/a-fusible.htm, "Fubsible (Low Temp) Alloys", Nov. 5, 2004, pp. 4 total.

* cited by examiner

*Primary Examiner*—Carl Whitehead, Jr.
*Assistant Examiner*—Jennifer M Dolan
(74) *Attorney, Agent, or Firm*—Blakely, Sokoloff, Taylor & Zafman LLP

(57) ABSTRACT

Various methods and apparatuses are described in which a micro-electro-mechanical systems (MEMS) device is encapsulated with a material having a variable viscosity with a viscosity value high enough to retard foreign material from contacting the MEMS device during an electronic package assembly process. The material having the variable viscosity may be affixed to a cavity area surrounding the MEMS device prior to an epoxy being dispensed onto the electronic package assembly. The temperature and pressure conditions of the electronic package assembly process may be controlled to ensure when the epoxy is dispensed that the material having the variable viscosity has a high enough viscosity value to retard foreign material from contacting the MEMS device during the electronic package assembly process.

10 Claims, 8 Drawing Sheets

METHODS AND APPARATUSES FOR MICROELECTRONIC ASSEMBLY HAVING A MATERIAL WITH A VARIABLE VISCOSITY AROUND A MEMS DEVICE

BACKGROUND

1. Field

Aspects of embodiments of the invention relate to a microelectronic assembly, and more specifically to the assembly of a micro-electromechanical systems (MEMS) device on a MEMS substrate.

2. Discussion of Related Art

MEMS devices are mechanical devices such as fluid sensors, mirrors, actuators, pressure and temperature sensors, vibration sensors, valves, nano-technology machines, etc. that are formed on or in MEMS substrates, utilizing technologies such as photolithography that allow for very small devices to be formed. A MEMS device typically has one or more components that are movable relative to the MEMS substrate. Such a component usually requires freedom of movement for proper functioning of the MEMS device. Contaminants or particles that come into contact with such a component can restrict its freedom of movement and cause failure of the MEMS device. Some MEMS devices may also fail when they are exposed to moisture. The assembly of some electronic packages that include MEMS devices utilize unique and customized packaging solutions that are not compatible with standard bulk quantity electronic package assembly techniques.

BRIEF DESCRIPTION OF THE DRAWINGS

The drawings refer to embodiments of the invention in which.

DETAILED DESCRIPTION

In the following description, numerous specific details are set forth, such as examples of specific layers and arrangement of components in a microelectronic package assembly in order to provide a thorough understanding of the embodiments of the invention. It will be apparent, however, to one of ordinary skill in the art that the embodiments of the invention may be practiced without these specific details. For example, a wirebonded die on top of a flipchip die will be used as an example microelectronic package assembly; however, many other arrangements are also possible. One such arrangement may be a folded substrate having two flipchip dies on top of one another, etc. Thus, the specific details set forth are merely exemplary. The specific details may be varied from and still be contemplated to be within the spirit and scope of the present invention.

In general, various methods and apparatuses are described in which a micro-electro-mechanical systems (MEMS) device is encapsulated with a material having a variable viscosity with a viscosity value high enough to retard foreign material from contacting the MEMS device during an electronic package assembly process. The material having the variable viscosity may be affixed to a cavity area surrounding the MEMS device prior to an epoxy being dispensed onto the electronic package assembly. The temperature and pressure conditions of the electronic package assembly process may be controlled to ensure when the epoxy is dispensed that the material having the variable viscosity has a high enough viscosity value to retard foreign material from contacting the MEMS device during the electronic package assembly process.

Figure 1:
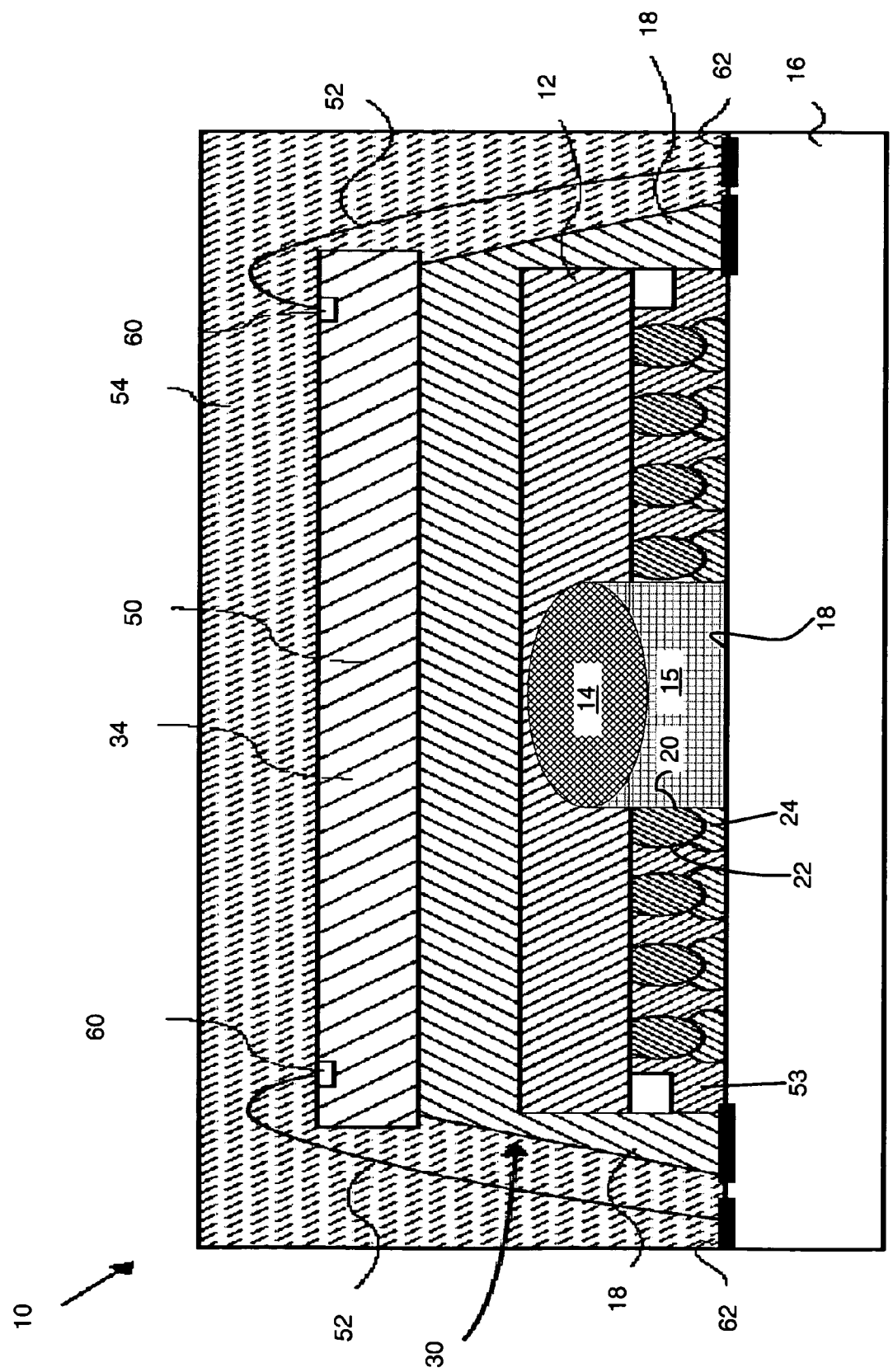
FIG. 1 is a cross-sectional side view of an embodiment of a microelectronic package assembly created with a material that has a variable viscosity with a viscosity value high enough to protect a MEMS device against the ingress of contaminants.

FIG. 1 is a cross-sectional side view of an embodiment of a microelectronic package assembly, wherein a material has a variable viscosity with a viscosity value high enough to protect a MEMS device against the ingress of contaminants. The microelectronic package assembly 10 may include a MEMS substrate 12, a MEMS device 14 on a lower side of the MEMS substrate 12, a carrier substrate 16 forming a cover piece for the MEMS device 14, interconnection elements 20, a thermal interface component 30, a microelectronic die 50, wirebonding wires 52, epoxy encapsulation material 54, underfill material 53, and a keep out cavity area 15.

The MEMS substrate 12 may have a plurality of alternating dielectric and metal layers. The metal layers can be patterned to form conductors. The conductors are connected to the MEMS device 14 and an integrated circuit formed within the MEMS substrate 12.

One or more MEMS devices 14 may be manufactured on a side of the MEMS substrate 12, such as the lower side. The MEMS device 14 has one or more components that are movable relative to the MEMS substrate 12. In order to allow for freedom of movement of the component or components, and proper functioning of the MEMS device 14, contaminants and other particles should be kept away from the MEMS components.

The keep out cavity area 15 may be filled with a material having a variable viscosity to encapsulate the MEMS device 14 during the electronic package assembly process. The keep out cavity area 15 creates a zone around the MEMS device 14 filled with the variable viscosity material to protect the MEMS device 14 during the manufacturing packaging process but later allows the MEMS device 14 to operate freely at a normal operating temperature. The cavity area filled with viscous material encapsulates the MEMS between the lower side of the MEMS substrate and at the bottom with the upper side of the carrier substrate 16. The viscous material 18 filling the keep out zone prevents contaminants or moisture from entering laterally into a space between the carrier substrate 16 and the MEMS substrate 12 where the MEMS device 14 is located.

The viscosity of a material describes how "thick" a liquid, gas or solid is and correspondingly how easily does foreign material move through the material. Thus, viscosity may be a measure of a material's internal resistance of a fluid, solid, or gas to deformation under shear stress. The physical unit of dynamic viscosity may be measured in Pascal-second (Pa·s), which is equivalent to 1 kg/m·s (kilogram per meter second). For a material in a liquid phase, viscosity is independent of pressure and the viscosity value tends to fall as temperature increases. The viscosity value of a material in a fully liquid phase, for example castor oil, may be around 1 to 2 Pa·s. For a material in a fully solid phase, the viscosity value may be very high such as greater than $10^{12}$ Pa·s.

The material having the variable viscosity may be affixed to the keep out cavity area 15 by creating a mechanical bond, a chemical bond, a mechanical and a chemical bond or other similar bonding technique between the material and the MEMS substrate 12 surrounding the MEMS device 14. A chemical bond may be created between the material and the MEMS substrate 14 by treating the cavity area 15 to be a hydrophilic region, the material to be a hydrophilic compound, and the area surrounding the cavity area 15 to be a hydrophobic region. A hydrophilic compound may be one that is electrically polarized and capable of H-bonding, enabling the material to adhere more readily to a hydrophilic region or be repelled and stay out of a hydrophobic region. The chemical treatment could also include selectively depositing thin films in or around the desired regions to create the hydrophobic region and the hydrophilic region. Accordingly, the chemical treatment preparation of the surfaces making up the cavity area may be performed as a routine step during the actual MEMS/circuit fabrication processes.

Melting the material and then allowing the material to cool and thicken in the cavity area may create a mechanical bond between the material and the MEMS substrate.

The material with a variable viscosity has a viscosity value high enough to retard foreign material from contacting the MEMS device. The material encapsulates the MEMS device prior to an epoxy being dispensed during the electronic package assembly process. The material with a variable viscosity may be, for example: a solder compound, such as an Indium-based solder compound with a melting point equal to or greater than 157 degrees Celsius (C.), a Tin-based solder compound with a melting point equal to or greater than 135 C., a Bismuth based alloy solder compound with a melting point selectable between 47 and 227 C.; a polymer compound such as a translucent plastic polymer with a melting point above 100 C. but below 150 C.; or other similar material capable of significantly altering its viscosity value based on ambient temperature and pressure conditions. The materials with a variable viscosity may include the characteristic of being capable of a rapid phase change between a liquid and a solid state with a small temperature range between the two states.

A surface of the carrier substrate 16 may form one of the boundaries of the keep out cavity area 15. The carrier substrate 16 may have a plurality of alternating dielectric and metal layers. The metal layers can be patterned to provide redistribution of signals, ground and power through the carrier substrate 16.

Each interconnection element 20 includes a respective solder ball 22 on a lower side of the MEMS substrate 12, and a respective conductive land 24 on an upper side of the carrier substrate 16. Each solder ball 22 is electrically connected to a respective metal line formed in the MEMS substrate 12, and each conductive land 24 is electrically connected to a respective metal line formed in the carrier substrate 16. The MEMS substrate 12 is placed on the carrier substrate 16. As mentioned, the carrier substrate 16 then forms a cover piece over the MEMS device 14. Each solder ball 22 is then in contact with a respective one of the conductive lands 24.

The entire assembly may be placed in a reflow oven. The reflow oven heats the solder balls 22 so that they melt and join with the conductive lands 24. The reflow oven also causes a phase change in the material having a variable viscosity. The assembly is then allowed to cool, so that the solder balls 22 again solidify. The solder ball and conductive land form an interconnection element 20. Each solder ball 22 is then electrically and structurally connected to a respective one of the conductive lands 24.

Signals can then be provided from the metal lines in the carrier substrate 16 through the interconnection elements 20 and the metal lines in the MEMS substrate 12 to and from the MEMS device 14. Power and ground are also provided to the MEMS device 14. The signals, power, and ground allow for functioning of the MEMS device 14, i.e., movement of the movable component or components of the MEMS device 14.

The thermal interface component 30 has a central portion 34 and perimeter components 18 extending downwardly from edges of the central portion 34. The microelectronic die 50 is placed on the thermal interface component 30. The thermal interface component 30 may be used to attach the microelectronic die 50 to the MEMS substrate 12. The thermal interface component 30 may also be used later in the operation of the MEMS device to control the viscosity value of the materials with a variable viscosity.

The microelectronic die 50 has an integrated circuit formed therein. Terminals 60 are formed on an upper surface and near edges of the microelectronic die 50. The terminals 60 are in communication with the integrated circuit formed in the microelectronic die 50.

Terminals 62 are formed on an upper surface of the carrier substrate 16 outside an area of the perimeter components 18. Each wirebonding wire 52 has opposing ends that are attached to one of the terminals 60 and one of the terminals 62, respectively. The wirebonding wires 52 connect the carrier substrate 16 electrically to the microelectronic die 50.

An epoxy encapsulation 54 is formed over the components hereinbefore mentioned. The epoxy encapsulation 54 structurally, electrically, and chemically protects components such as the wirebonding wires 52 and the microelectronic die 50. The epoxy encapsulation 54 cures when mixed with a catalyzing agent.

The underfill material 53 is located between the interconnection elements 20. The underfill material 53 is typically a liquid plastic polymer that is cured so that it hardens. The underfill material 53 then protects the interconnection elements 20 against structural damage and against contaminants and particles.

Figure 2A:
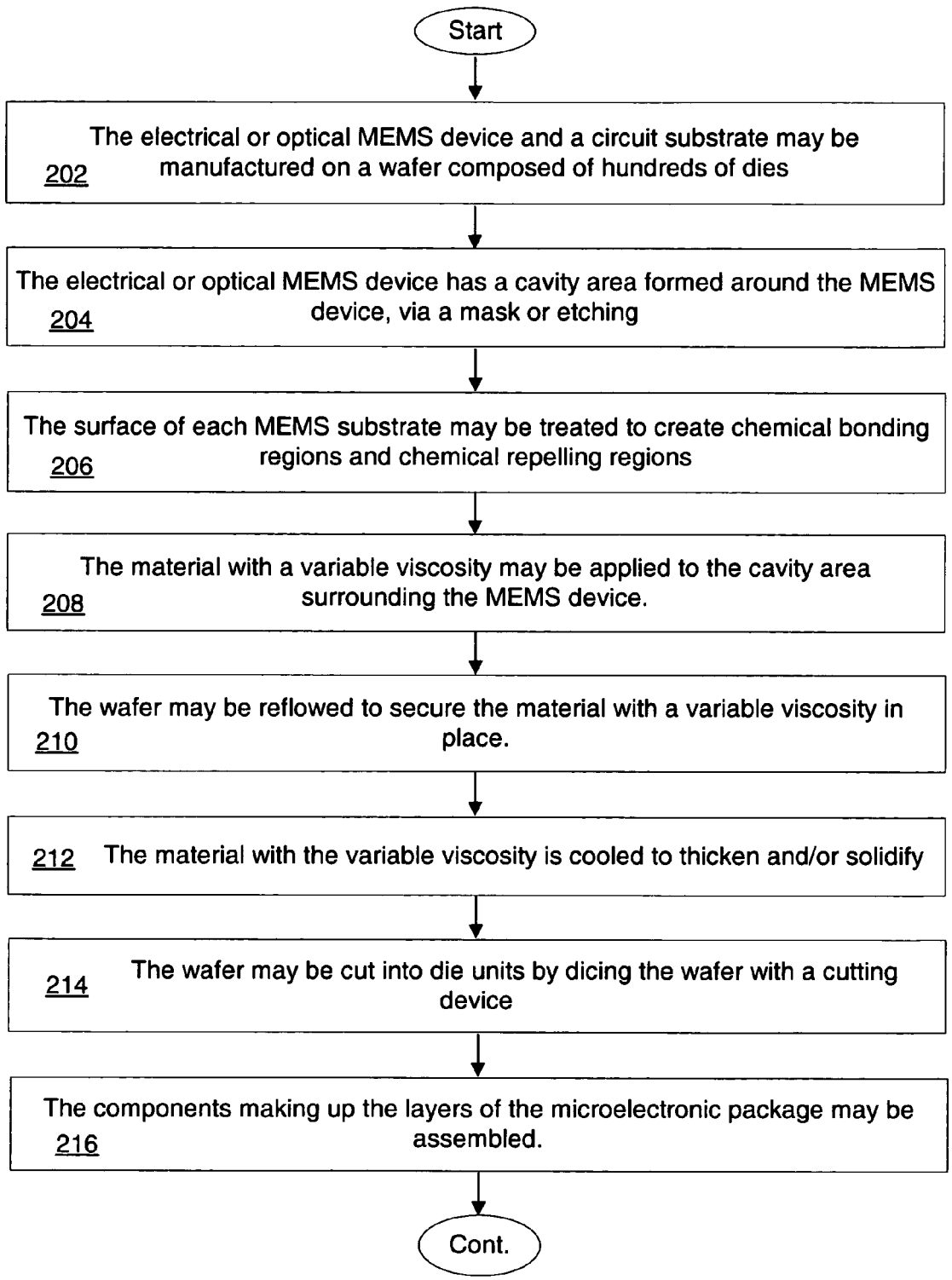
FIG. 2a and FIG. 2b are flow diagrams of an embodiment of an assembly of the microelectronic package assembly that includes a MEMS device.
Figure 2B:
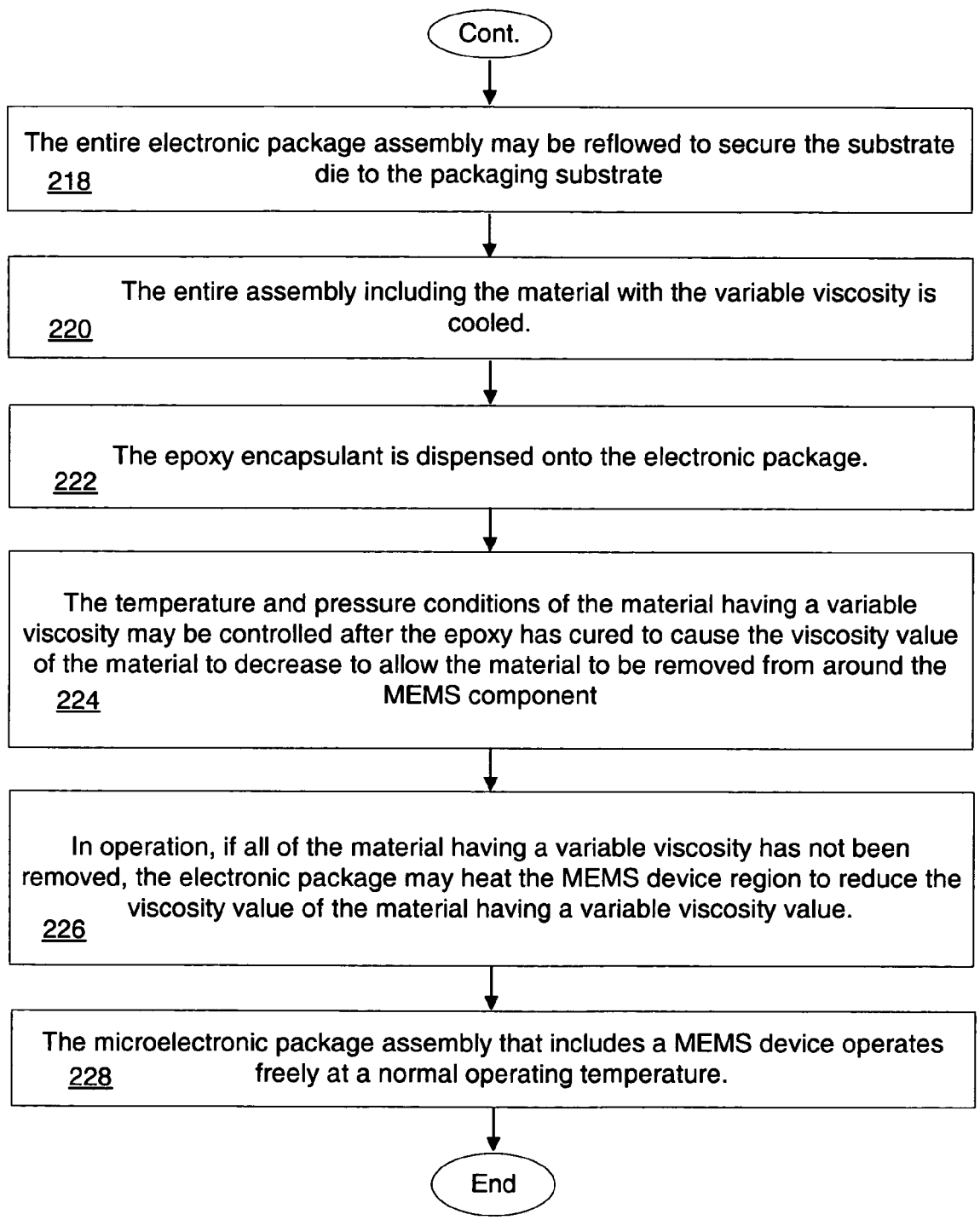

FIG. 2a and FIG. 2b are flow diagrams of an embodiment of an assembly of the microelectronic package assembly that includes a MEMS device. Electrical and optical MEMS devices with circuit substrates may be manufactured on a wafer composed of hundreds of dies. Each die may be part of a microelectronic package. Several manufacturing techniques exist that may use some or all of the operations discussed below. In one of those techniques a computer controlled machine controls many of the operations discussed below to create the microelectronic package assembly that includes a MEMS device.

In block 202, the electrical or optical MEMS device and a circuit substrate may be manufactured on a wafer composed of hundreds of dies.

In block 204, the electrical or optical MEMS device has a cavity area formed around the MEMS device, via a mask or etching.

In block 206, the surface of each MEMS substrate may be treated to create chemical bonding regions, such as hydrophilic regions, and chemical repelling regions, such as hydrophobic regions. Further, thin films may be added to a desired region to create a hydrophilic region or hydrophobic region. The surfaces of the cavity area surrounding the MEMS device can also be treated to be a hydrophilic region. The area around the cavity area can also be treated to be a hydrophobic region. The material having a variable viscosity may be originally created to have hydrophilic properties. The hydrophilic properties enable the material with a variable viscosity to adhere more readily to a hydrophilic region and be repelled and stay out of a hydrophobic region.

In block 208, the material with a variable viscosity may be applied to the cavity area surrounding the MEMS device. The material with a variable viscosity may be sprayed or screened onto the cavity area when in a gel phase, liquid phase, and/or paste phase. For example, material in paste phase can be screened with the use of masks over the MEMS device and desired area. Other materials with a variable viscosity can be heated above their melting point and "dot" dispensed in syringe forms. After the material is applied and surrounds the MEMS device, the material may be cooled. The lower temperature of the material increases the viscosity value of the material. Accordingly, the micro-electro-mechanical systems (MEMS) device is encapsulated within the material having a variable viscosity. The material having a variable viscosity after cooling has a viscosity value high enough to prevent foreign material from contacting the MEMS device during an electronic package assembly process.

In block 210, the wafer may be reflowed to secure the material with a variable viscosity in place. A phase change, such as melting, of the material with a variable viscosity may occur during the reflow operation. One or more masks may be put in place to hold the material with a variable viscosity in place during the reflow process. Thus, a guard ring formed with a mask may be used to provide additional support for the chemical bonding techniques described above to keep the material in the cavity area while in a liquid state. The reflow operation at elevated temperatures may also assist in providing the energy needed to create the mechanical and chemical affixing bonds between material with the variable viscosity and the cavity area.

In block 212, the material with the variable viscosity is cooled to thicken and/or solidify in order to prevent the material from being removed during sawing in the singulation process. If a mask/screen was used to keep the viscous material in the cavity area when the material changed phases, then the mask may be removed when the viscous material is cooled.

In block 214, the wafer may be cut into die units by dicing the wafer with a cutting device, such as a saw, laser, etc. Note, no mask will be in place during the singulation process.

In block 216, the components, such as the MEMS substrate, MEMS device, the carrier substrate, etc. making up the layers of the microelectronic package may be assembled.

When the material with the variable viscosity cools, its viscosity value is high enough to prevent foreign material from contacting the MEMS device during the electronic package assembly process. If the material with the variable viscosity is a solder or a plastic polymer, then a mechanical bond will also be created between the MEMS substrate and the material as the material solidifies. Thus, the material with the variable viscosity is affixed to the keep out cavity area surrounding the MEMS device by creating a mechanical bond and/or chemical bond between the material and the MEMS substrate. The solidified material with the variable viscosity encapsulates the MEMS device and stays in place.

In block 218, the entire electronic package assembly may be reflowed to secure the substrate die to the packaging substrate, sometimes referred to as chip attach, in either a wire bond package, a C4 flip chip package, or similar package. The entire electronic package assembly is exposed to elevated temperatures to melt solder in the chip attach process and cause a significant shift in the viscosity value, such as a phase change, of the material with the variable viscosity. A guard ring formed with a mask may be used to provide additional support for the chemical bonding techniques described above to keep the material with the variable viscosity in the desired region while in a liquid state. An example temperature range for the reflow operation of the entire electronic package assembly during chip attach may be between 150 C. to 240 C.

In block 220, the entire assembly including the material with the variable viscosity is cooled. The material with the variable viscosity thickens and/or solidifies in order to prevent the material from being removed during the epoxy dispense. If a mask/screen was used to keep the viscous material in the cavity area when the material changed phases, then mask may be removed when the viscous material is cooled.

When the material with the variable viscosity cools its viscosity value is high enough to prevent foreign material from contacting the MEMS device during the remainder of the electronic package assembly process. The solidified material with the variable viscosity encapsulates the MEMS device and stays in place while the epoxy is dispensed and cured.

In block 222, the epoxy encapsulant is dispensed onto the electronic package. The temperature and pressure conditions of the electronic package assembly process may be controlled to ensure that when the epoxy is dispensed and cured that the material having the variable viscosity has a high enough viscosity value to inhibit foreign material from contacting the MEMS device. The epoxy encapsulant cure may occur in a variety of ways such as a partial cure or a full cure.

A partial cure process is performed at high temperatures to partially cure the epoxy. The partial cure occurs at example temperatures of +70 C. to +100 C. to prevent wet epoxy from moving to undesired regions and causing visual or functional defects. The material having the variable viscosity may have either a melting point above +70 C. to 100 C. or density greater than the density of the epoxy.

A full cure process is performed at elevated temperatures from +130 C. to +200 C. to accelerate the cure time and thus reduce processing time. The elevated temperatures should not disturb the material encapsulating the MEMS, if a partial cure has been previously performed. Once a partial cure has occurred the material having the variable viscosity will be trapped and will not be able to move even in liquid form. Further the material having the variable viscosity may have a significantly greater density than the epoxy or underfill material causing an "oil and water" type interaction where the materials will not mix.

In block 224, the temperature and pressure conditions of the material having a variable viscosity may be controlled after the epoxy has cured to cause the viscosity value of the material to decrease, such as a phase change, to allow the material to be removed from around the MEMS component. The electronic package assembly may include one or more channels formed in the MEMS substrate to allow for the variable viscosity material to be removed after the chip attach and encapsulation processing has occurred. The variable viscosity material is applied to regions beyond the MEMS device and in these channels to allow the subsequent removal of all of the material from the electronic package assembly. Removing the material having a variable viscosity eliminates MEMS issues with the material conducting electrical current, interacting with light conditions, and/or the material interfering with the monitoring of pressures/forces. Thus, after chip attach and encapsulation, the package and device temperature may be elevated to phase change the material having a variable viscosity from a solid to a liquid. The material having a variable viscosity is then pumped out and away from the MEMS device using positive or negative pressure.

In block 226, in operation, if all of the material having a variable viscosity has not been removed, the electronic package may heat the MEMS device region to reduce the viscosity value of the material having a variable viscosity value. The MEMS device is then allowed to operate freely at a normal operating temperature. The material that has a variable viscosity value may have a viscosity value when at a temperature of between 20% above and 20% below the normal operating temperature of the MEMS device to allow the uninhibited movement of the MEMS component moveable parts.

In operation, the normal operating temperature of an example MEMS component that use transistors may be in the operating ranges of +23 C. to +110 C. The normal operating temperature of a second example MEMS component that use transistors may be in the operating ranges of −25 C. to +125 C. In an embodiment, the material having a variable viscosity is left within the shipped electronic package if the MEMS device performs merely mechanical functionality such as valves, gears, etc.

In block 228, the microelectronic package assembly that includes a MEMS device operates freely at a normal operating temperature. The microelectronic package assembly may activate a local heater to increase temperature to an operating temperature required for a phase change of the material having a variable viscosity. Alternatively, the ambient operating temperature conditions may provide enough energy to keep the material having a variable viscosity in a low viscosity value state.

It will be appreciated that more or fewer process blocks may be incorporated into the method illustrated in FIGS. 2a-2b. Further, no particular order is implied by the arrangement of blocks shown and described herein. For example, in one embodiment, processes represented by blocks may be performed in parallel, out of order, repeated, etc. Additional example alteration may include the following. The material with a variable viscosity may be applied to the cavity area surrounding the MEMS device after the die attach process blocks in wire bond packages rather then before the die attach. The material with a variable viscosity may be in a solid phase when applied. A second reflow operation at potentially a lower temperature than the overall reflow operation can be inserted into the assembly process to bond the material to the cavity area. The singulation of the die may occur before or after the chip attach process occurs. An underfill process may occur prior to the epoxy cure. The underfill processes may be dispensed and flown from +45 C. to +70 C.

Figure 3:
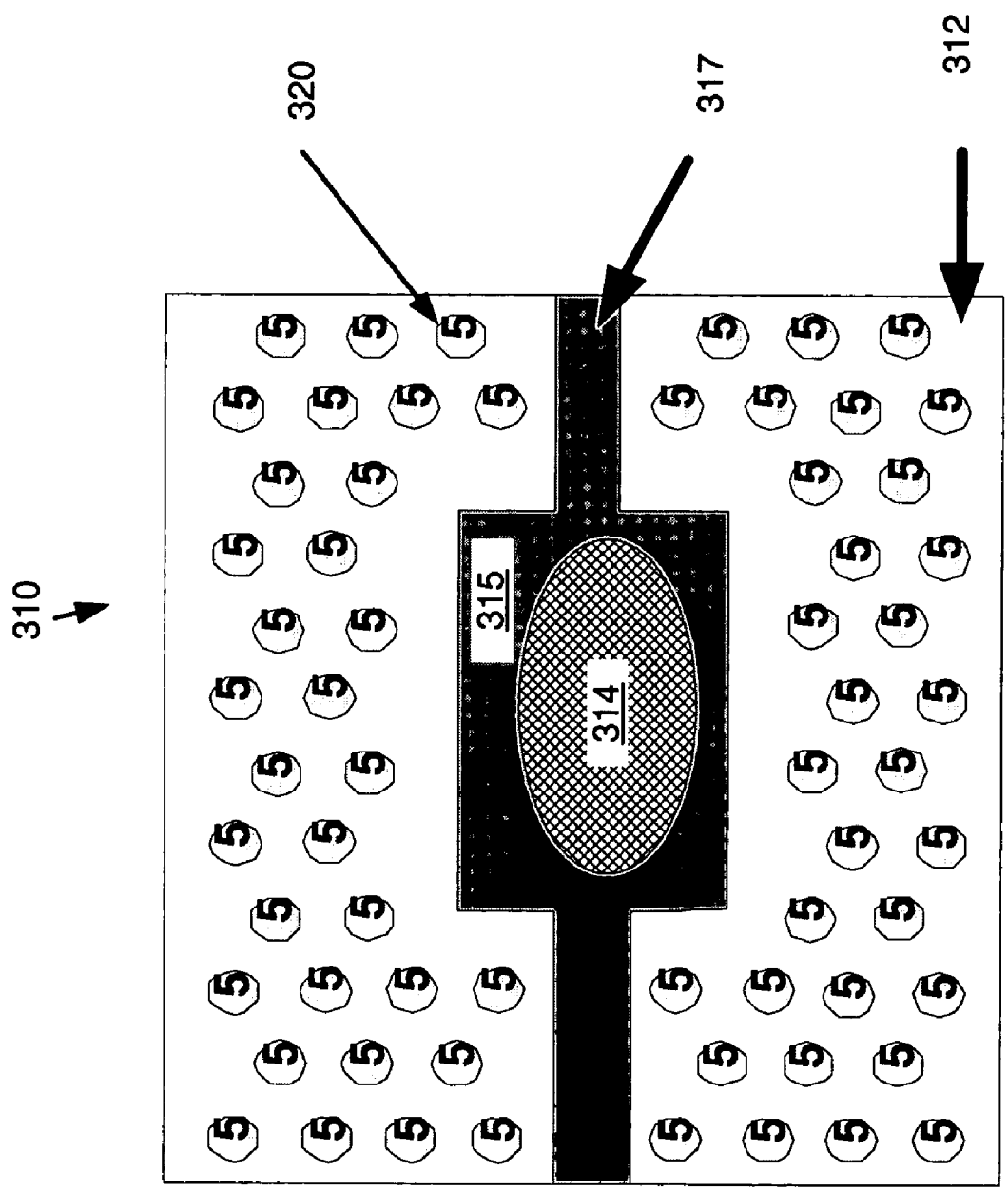
FIG. 3 is a top down view of a cross-section of an embodiment of a microelectronic package assembly that has one or more channels formed in the substrate.

FIG. 3 is a top down view of a cross-section of an embodiment of a microelectronic package assembly that has one or more channels formed in the substrate. The microelectronic package assembly 310 may include a MEMS substrate 312, a MEMS device 314 on the MEMS substrate 312, interconnection elements 320, a keep out cavity area 315, and one or more channels 317 formed in the MEMS substrate 312.

The temperature and pressure conditions of the material having a variable viscosity with a viscosity value may be controlled after the epoxy has cured to phase change the material to allow the material to be removed from around the MEMS device 314. The variable viscosity material may be applied to regions beyond the MEMS device 314 in channels 317 formed in the substrate 312. The material is removed via the channel 317 after the chip attach process and the epoxy has cured. After the chip attach and encapsulation by epoxy, the package and device temperature may be elevated to phase change the variable viscosity material from a solid to a liquid. The variable viscosity material is pumped out through the channels using positive or negative pressure. The variable viscosity material may be used with many types of MEMS devices that in operation conduct electrical current, require interaction with light, or monitor pressures. The variable viscosity material is removed from the microelectronic package assembly preventing any interaction with the above parameters.

Figure 4:
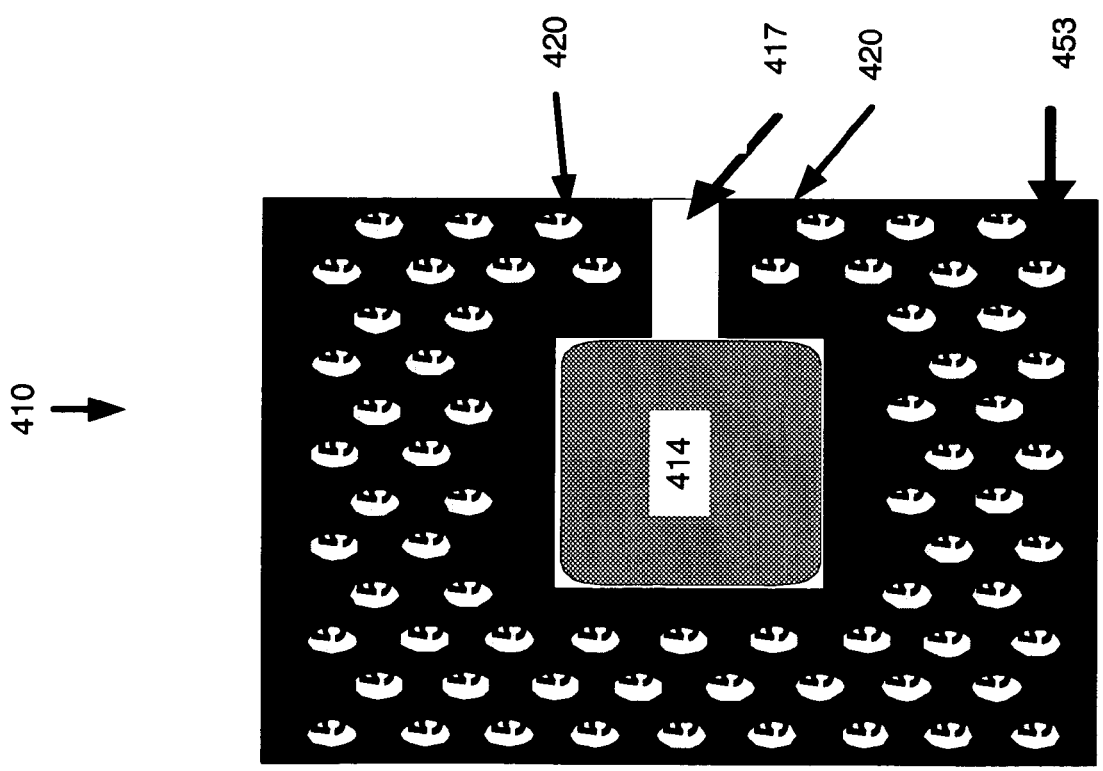
FIG. 4 is a top down view of a cross-section of an embodiment of a microelectronic package assembly that has one channel formed in the substrate.

FIG. 4 is a top down view of a cross-section of an embodiment of a microelectronic package assembly that has one channel formed in the substrate. The microelectronic package assembly 410 may include an optical MEMS device 414 that has one channel formed 417 in the substrate 412 and between the interconnection elements 420. The variable viscosity material has been removed after the interconnect underfill 453 has occurred.

Figure 5:
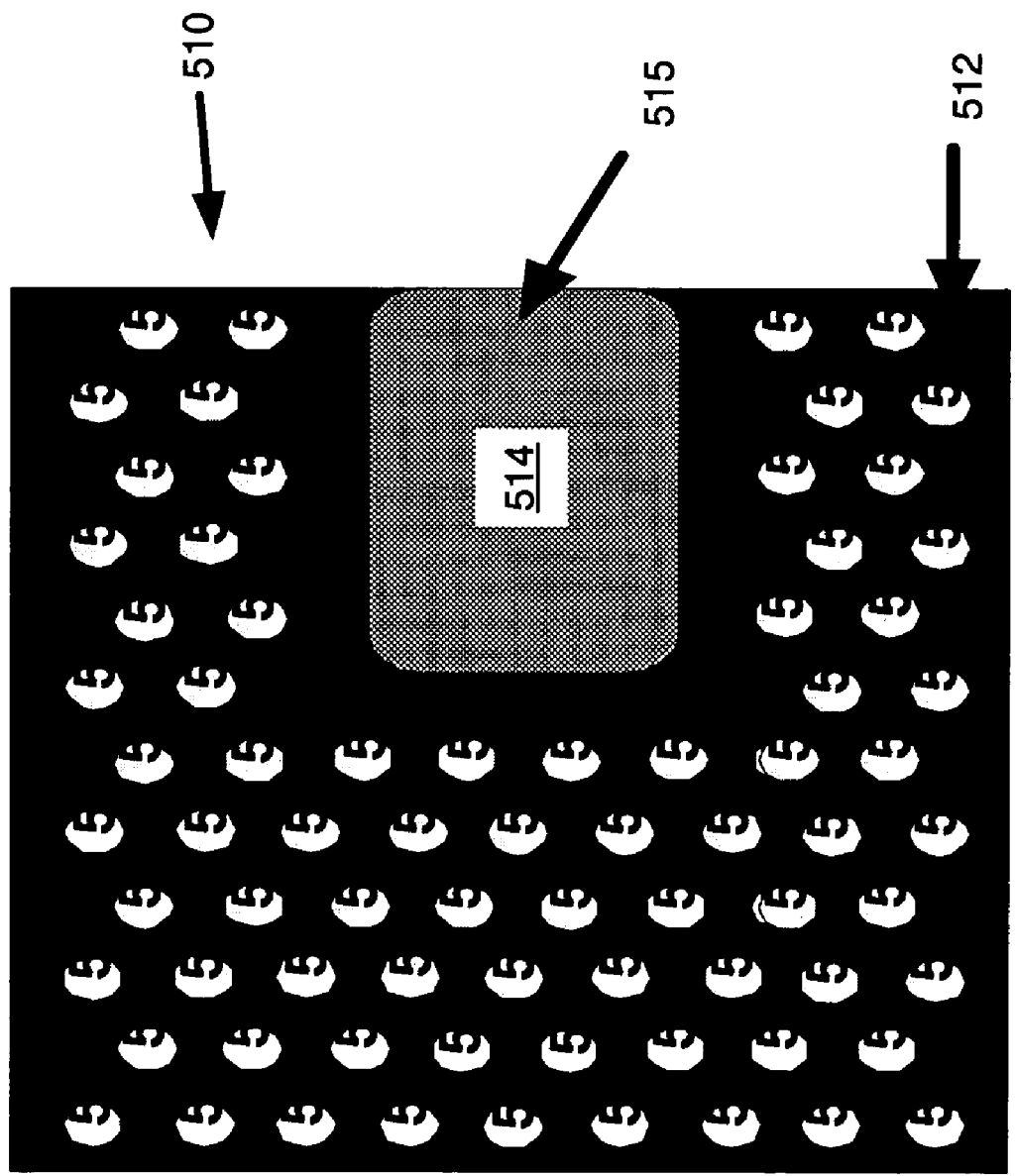
FIG. 5 is a top down view of a cross-section of an embodiment of a microelectronic package assembly that has the cavity area formed on the side of the substrate.

FIG. 5 is a top down view of a cross-section of an embodiment of a microelectronic package assembly 510 has the cavity area formed on the side of the substrate. The microelectronic package assembly 510 that has the cavity area 515 formed on the side of the substrate 512.

Figure 6:
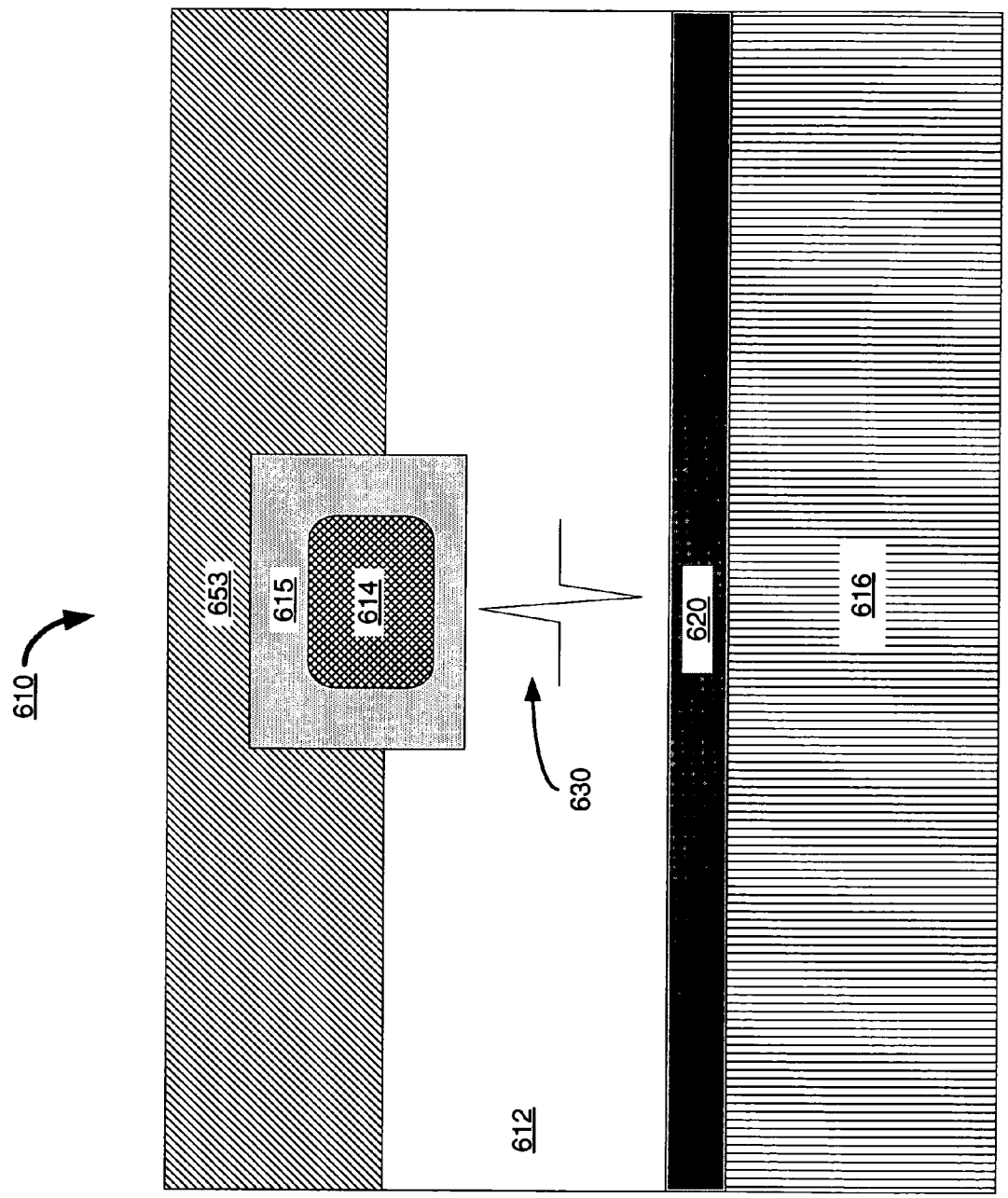
FIG. 6 is a cross-sectional view of an embodiment of a microelectronic package assembly that has the cavity area filled with a material having a variable viscosity value.

FIG. 6 is a cross-sectional view of an embodiment of a microelectronic package assembly that has the cavity area filled with a material having a variable viscosity value. The microelectronic package assembly 610 has a MEMS device 614, a cavity area 615 filled with a material having a variable viscosity value, a MEMS substrate 612, epoxy underfill material 653, a resistive heating source 630, die attach material 620, and a package substrate 616.

Figure 7:
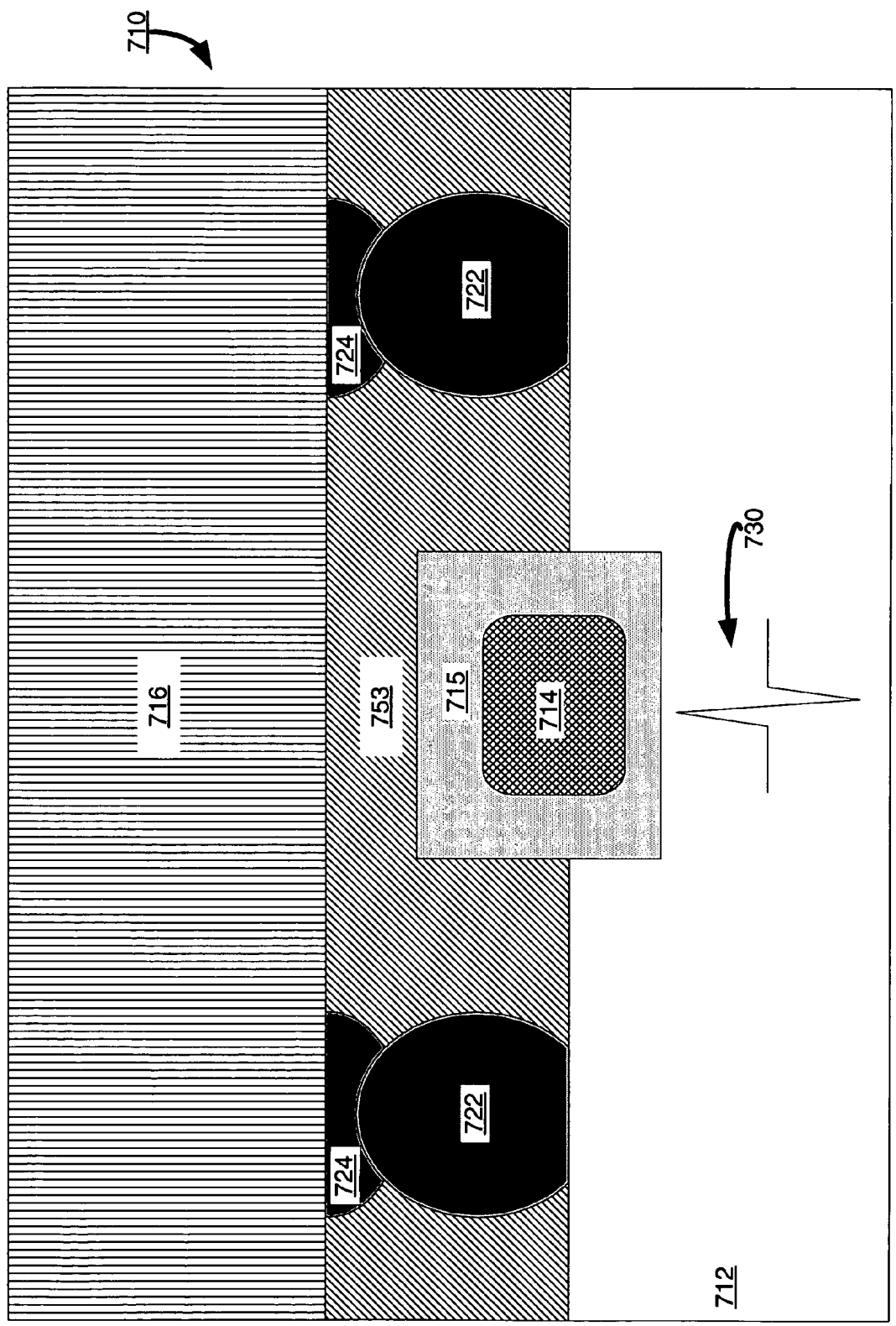
FIG. 7 is a cross-sectional view of an embodiment of a microelectronic package assembly that has the cavity area filled with a material having a variable viscosity value.

FIG. 7 is a cross-sectional view of an embodiment of a microelectronic package assembly that has the cavity area filled with a material having a variable viscosity value. The microelectronic package assembly 710 has a MEMS device 714, a cavity area 715 filled with a material having a variable viscosity value, a MEMS substrate 712, epoxy underfill material 753, a resistive heating source 730, a package substrate 716 and a solder ball 722 on a one side of the MEMS substrate 712 and a respective conductive land 724 on one side of the carrier substrate 716. The MEMS device 714 may be suspended in the cavity area 715. The microelectronic package assembly 710 may be a C4-flip chip package.

The material having the variable viscosity if it remains in the electronic package assembly during shipping and transport can protect the MEMS device from being damaged during the shipping and transport. For example, the material having the variable viscosity may be in a solid phase and encapsulate the MEMS device during shipping and transport.

In one embodiment, the software used to facilitate the operations of the electronic package assembly process can be embodied onto a machine-readable medium. A machine-readable medium includes any mechanism that provides (e.g., stores and/or transmits) information in a form readable by a machine (e.g., a computer, Computerized Numerical Control (CNC) machine, etc.). For example, a machine-readable medium includes read only memory (ROM); random access memory (RAM); magnetic disk storage media; optical storage media; flash memory devices; Digital VideoDisc (DVD's), electrical, optical, acoustical or other form of propagated signals (e.g., carrier waves, infrared signals, digital signals, Electrically Programmable ROM (EPROMs), Electrically Erasable Programmable ROM (EEPROMs), FLASH memory, magnetic or optical cards, or any type of media suitable for storing electronic instructions.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A microelectronic assembly, comprising:
   a MEMS substrate;
   a MEMS device on the MEMS substrate, the MEMS device having a MEMS component which is movable relative to the MEMS substrate;
   a cavity area surrounding the MEMS device at least partially formed by the MEMS substrate; and
   a material having a variable viscosity filling the cavity area, wherein the material has a viscosity value high enough to prevent foreign material from contacting the MEMS device during a manufacturing packaging process but later allows the MEMS device to operate freely at a normal operating temperature, wherein the material is one of (i) a bismuth-based alloy solder compound with a melting point equal to or greater than 47° C. or (ii) a translucent plastic polymer with a melting point above 100° C. but below 150° C.

2. The microelectronic assembly of claim 1, wherein the material having a variable viscosity is electrically non-conductive.

3. The microelectronic assembly of claim 1, wherein the cavity area is a hydrophilic region, the material is a hydrophilic compound, and an area surrounding the cavity area is a hydrophobic region to affix the material to the cavity area around the MEMS.

4. The microelectronic assembly of claim 3, wherein the material to affix to the cavity area around the MEMS device is affixed prior to an epoxy being dispensed during the manufacturing packaging process.

5. A computer readable medium containing instructions to cause a machine to create the microelectronic assembly of claim 1.

6. A microelectronic assembly, comprising:
   a MEMS substrate with a channel formed in the MEMS substrate;
   a MEMS device on the MEMS substrate; and
   a cavity area surrounding the MEMS device at least partially formed by the MEMS substrate; and
   a material having a variable viscosity filling the cavity area, wherein the material has a viscosity value high enough to prevent foreign material from contacting the MEMS device during an electronic package assembly process, wherein the material having the variable viscosity is adapted to affix to the cavity area around the MEMS device prior to an epoxy being dispensed during the electronic package assembly process and the channel is adapted to remove the material after the epoxy has cured, wherein the material is one of (i) a tin-based solder compound with a melting point equal to or greater than 135° C. or (ii) a translucent plastic polymer with a melting point above 100° C.

7. The microelectronic assembly of claim 6, wherein the material is affixed to the cavity area by creating a mechanical bond between the material having the variable viscosity and the cavity area.

8. The microelectronic assembly of claim 6, wherein the MEMS device is an optical device.

9. The microelectronic assembly of claim 6, wherein the material that has the variable viscosity value is a hydrophilic compound and a thin film creates a hydrophilic surface in the cavity area.

10. A computer readable medium containing instructions to cause a machine to create the microelectronic assembly of claim 6.

* * * * *